United States Patent
Coldren et al.

(10) Patent No.: US 6,714,572 B2
(45) Date of Patent: Mar. 30, 2004

(54) TAPERED AIR APERTURES FOR THERMALLY ROBUST VERTICAL CAVITY LASER STRUCTURES

(75) Inventors: Larry A. Coldren, Santa Barbara, CA (US); Ryan L. Naone, Boulder, CO (US)

(73) Assignee: The Regents of the University of California, Oakland, CA (US)

( * ) Notice: Subject to any disclaimer, the term of this patent is extended or adjusted under 35 U.S.C. 154(b) by 114 days.

(21) Appl. No.: 09/728,931

(22) Filed: Dec. 1, 2000

(65) Prior Publication Data

US 2002/0067748 A1 Jun. 6, 2002

Related U.S. Application Data

(60) Provisional application No. 60/168,415, filed on Dec. 1, 1999.

(51) Int. Cl.$^7$ .............................. H01S 5/00; H01L 21/00

(52) U.S. Cl. ............................. 372/46; 372/45; 438/22; 438/45

(58) Field of Search ........................ 372/45, 46, 43–44; 438/22, 45

(56) References Cited

U.S. PATENT DOCUMENTS 6,324,192 B1 * 11/2001 Tayebati ...................... 372/20

OTHER PUBLICATIONS

R.L. Naone, E. R. Hegblom, B. J. Thibeault, and L. A. Coldren, "Oxidation of AlGaAs layers for tapered apertures in vertical–cavity lasers," Electron. Lett., vol. 33, pp. 300–301, 1997.

E. R. Hegblom, B. J. Thibeault, R. L. Naone, and L. A. Coldren, "Vertical cavity lasers with tapered oxide apertures for low scattering loss," Electron. Lett., vol. 33, pp. 869–871, 1997.

E. R. Hegblom, N. M. Margalit, A. Fiore, and L. A. Coldren, "Small efficient vertical cavity lasers with tapered oxide apertures," Electron. Lett., vol. 34, pp. 895–897, 1998.

R. L. Naone, P. D. Floyd, D. B. Young, E. R. Hegblom, T. A. Strand and L. A. Coldren, "Interdiffused quantum wells for lateral carrier confinement in VCSEL's," IEEE J. Sel. Top. Quantum Electron., vol. 4, pp. 706–714, 1998.

(List continued on next page.)

Primary Examiner—Paul Ip
Assistant Examiner—James Menefee
(74) Attorney, Agent, or Firm—Lyon & Harr, LLP; Richard T. Lyon

(57) ABSTRACT

A process for forming a Vertical Cavity Laser (VCL) structure that includes using an intermixing technique involving an high temperature annealing operation to overcome lateral carrier diffusion away from the center of the active region of the VCL. Degrading effects of the high temperature annealing are avoided by first restricting the dopant associated with the p-type Bragg reflector (DBR) region of the VCL to low diffusivity types such as carbon, thus eliminating a thermally-induced diffusion that occurs when other p-type dopants such as beryllium (Be), Zinc (Zn), or Magnesium (Mg) are employed. Further, the oxide created to act as an aperture in a conventional VCL structure is removed leaving behind an air gap having the shape of the oxide aperture. It was found that the degrading effects associated with annealing the VCL structure were minimized using carbon as the p-type dopant and air gap apertures. In addition, it was determined that the annealed, air gap apertured, VCL provided the same optical loss properties previously attributed only to an un-annealed, oxide-apertured, VCL—but without sacrificing efficiency due to lateral carrier diffusion.

17 Claims, 3 Drawing Sheets

OTHER PUBLICATIONS

J. M. Dalesasse, N. Holonyak, Jr., A.R. Sugg, T. A. Richard, and N. El–Zein, "Hydrolyzation oxidation of AlxGa 1–xAs–AlAs–GaAs quantum well heterostructures and superlattices," Appl. Phys. Lett., vol. 57, pp. 2844–2846, 1990.

W.–Y. Hwang, D. L. Miller, Y. K. Chen, and D. A. Humphrey, "Carbon doping of InGaAs in solid–source molecular beam epitaxy using carbon tetrabromide," J. Vac. Sci. Technol. B, vol. 12, pp. 1193–1196, 1994.

J. W. Scott, B. J. Thiebault, D. B. Young, and L. A. Coldren, "High efficiency submilliamp vertical cavity lasers with intracavity contacts," IEEE Photon. Tech. Lett., vol. 6, pp. 678–680, 1994.

* cited by examiner

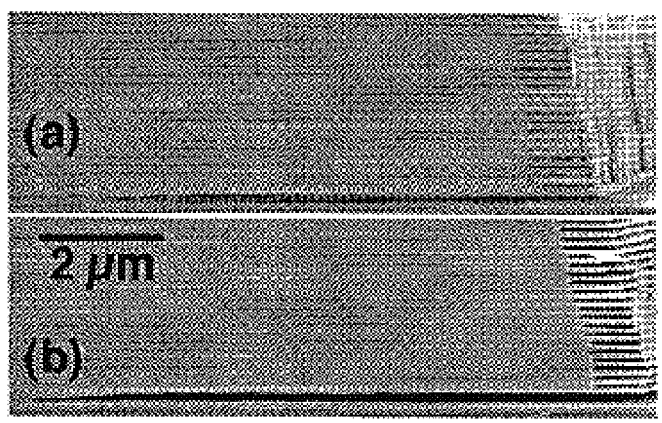
FIG. 2a
FIG. 2b
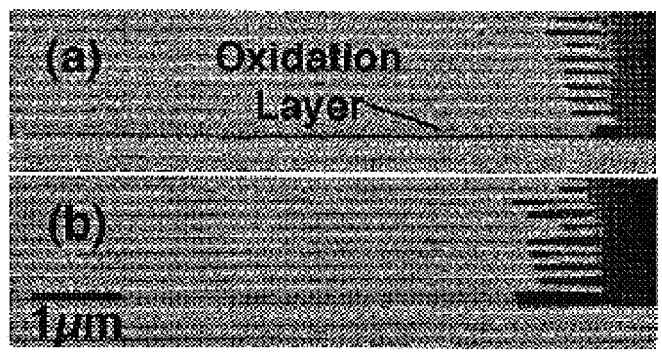
FIG. 3a
FIG. 3b
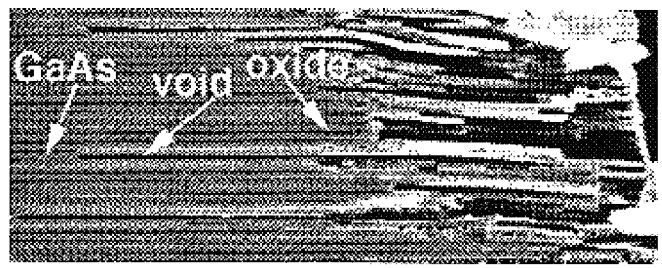
FIG. 6

TAPERED AIR APERTURES FOR THERMALLY ROBUST VERTICAL CAVITY LASER STRUCTURES

CROSS-REFERENCE TO RELATED APPLICATIONS

This application claims the benefit of a previously-filed provisional patent application Ser. No. 60/168,415, filed on Dec. 1, 1999.

STATEMENT REGARDING FEDERALLY SPONSORED RESEARCH

This invention was made with Government support under Grant No. DMR91-20007, awarded by the National Science Foundation, and Grant No. MDA972-98-1-0001, awarded by the Department of the Army. The Government has certain rights in this invention.

BACKGROUND

1. Technical Field

The invention is related to the formation of Vertical Cavity Laser (VCL) structures, and more particularly to a process for forming a VCL structure using an intermixing technique that includes a high temperature annealing operation.

2. Background Art

A typical VCL structure is formed from a layered semiconductor material, such as the material depicted schematically in FIG. 1. As can be seen, the depicted structure includes an oxidation region consisting of a thin AlAs layer and an adjacent 90% AlGaAs layers. In addition, there is usually a p-type distributed Bragg reflector (DBR) formed of alternating layers of GaAs and 90% AlGaAs overlying the oxidation region. Similarly, an n-type DBR is typically formed of alternating layers of GaAs and 90% AlGaAs, and underlies the oxidation region. The p-type DBR (or p-mirror) is usually created by doping the region via conventional methods with a p-type dopant such as beryllium (Be). The n-type DBR (or n-mirror) is similarly doped with a n-type dopant such as silicon (Si). The layered semiconductor material is typically etched to form a circular pillar or mesa consisting of the entire p-mirror and oxidation regions, and may extend partially into the n-mirror region.

In general, the oxidation region is formed from a series of layers having a graded content of an oxidizable material. In the exemplary structure depicted in FIG. 1, this oxidizable material is aluminum. The aforementioned grading results in the middle layer in the series of layers making up the oxidation region having the greatest overall concentration of the oxidizable material, while the layers overlying and underlying the middle layer comprise overall concentrations of the oxidizable material that are progressively less the further the layer is from the middle layer. In the exemplary structure depicted in FIG. 1, a layer of AlAs acts as the middle layer with adjacent layers of 90% AlGaAs constituting the overlying and underlying layer of having less of the oxidizable material (i.e., aluminum). It is noted that the "90%" designation indicates that there is only 90 percent of the amount of aluminum in a 90% AlGaAs, than in a AlAs layer. While not depicted in FIG. 1, the oxidation region could have additional outlying layers that contain even less aluminum. Further, the middle layer need not be pure AlAs. For example, in reference [1] the middle layer in the oxidation region of a tapered oxide apertured VCL structure was a layer of AlGaAs having an aluminum concentration greater than about 95%. The immediately adjacent oxidation region layers in the VCL structure of reference [1] were also AlGaAs, although with an aluminum concentration that is less than the middle layer but greater than about 70%.

The graded layer configuration of the oxidation region is of particular significance. While, a VCL structure can be formed with non-tapered oxide apertures, and sometimes is, the aforementioned grading will produce such a tapered shape [2]. A tapered oxide aperture more closely approximates an ideal lens and so, inter alia, lowers optical scattering losses and increases the performance of a small diameter VCL device. As such a tapered oxide aperture, while not required, is preferred. The tapered oxide aperture is created in the aforementioned oxidation region by taking advantage of the rapid reduction of the oxidation rate with lower Al content in the semiconductor layers. For example, in the exemplary VCL structure depicted in FIG. 1, the AlAs layer oxidizes at a rate approximately 10 faster than the adjacent 90% AlGaAs layer. Thus, when the previously formed mesa is subjected to an oxidation process, the thin AlAs layers oxidizes inwardly faster than the 90% AlGaAs layer producing the desired tapered oxide aperture as shown in FIG. 2(b).

Vast improvements in VCL efficiencies at low-output powers have been made possible by reducing the device size [3]. However, a persistent problem with current tapered, oxide-apertured, VCLs is that if the devices are made too small, the efficiency declines due to a current leak path caused by lateral carrier diffusion away from the center of the active region of the VCL. For example, the threshold current for a 6 μm diameter VCL device is twice the value expected from extrapolation of the broad-area threshold current density. This current leakage path is due to the aforementioned lateral carrier diffusion away from the center of the active region, the effect of which becomes even worse at smaller diameters.

It is noted that in the preceding paragraphs, as well as in the remainder of this specification, the description refers to various individual publications identified by a numeric designator contained within a pair of brackets. For example, such a reference may be identified by reciting, "reference [1]" or simply "[1]". A listing of the publications corresponding to each designator can be found at the end of the Detailed Description section.

SUMMARY

The present invention is directed at a process of forming a Vertical Cavity Laser (VCL) structure that overcomes the lateral diffusion problems of prior processes. Specifically, it has been discovered that the lateral diffusion phenomenon can be ameliorated by the use of standard intermixing techniques. However, these intermixing techniques require the VCL structure to undergo a high temperature annealing operation (e.g., 920 degrees C. for 180 s). It was found that the high temperature degraded the VCL structure considerably. For example, structures using beryllium (Be) as the p-type dopant experienced a high diffusion rate of the Be which caused an extensive redistribution of the dopant profile—so much so that the VCL would not lase. It is believe other p-type dopants, such as Zinc (Zn) or Magnesium (Mg), would cause similar or worse diffusion problems. In addition, the presence of the aforementioned oxide in the VCL structure during the annealing process caused serious structural degradation. Specifically, voids formed in the GaAs DBR layers which introduced excess scattering losses and a concomitant decrease in the efficiency of the VCL device. In addition, a noticeable downward bending of the layers along the circumference of the device was induced by the annealing process.

The present invention provides a solution to the degrading effects of the aforementioned high temperature annealing process on VCL structures. First, the p-type dopant is restricted to a low diffusivity dopant such as carbon, thus eliminating the diffusion problems associated with Be (or Zn, or Mg). Further, the oxide created to act as the aperture of the VCL is selectively removed leaving behind an air gap having the desired tapered shape. This oxide removal was accomplished by using a wet chemical approach employing a strong alkaline solution (e.g., a solution including KOH or NaOH) having a pH exceeding about 12–13. It was found that none of the above-described degradation occurred during the annealing of a VCL structure using carbon as the p-type dopant and air gap apertures. In addition, it was determined that the annealed, air gap apertured, VCL provided the same low optical loss properties previously attributed only to an un-annealed, oxide-apertured, VCL—but without sacrificing efficiency due to lateral carrier diffusion.

In addition to the just described benefits, other advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

FIGS. 2(a) and (b) are cross-sectional Scanning Electron Microscope (SEM) images of a mesa that in FIG. 2(a) has been oxidized at 400° C. for 30 min, and then in FIG. 2(b) had the oxide selectively etched out by a 1:12 KOH:$H_2O$ solution. The perspective is slightly different between (a) and (b), so the undercut taper only appears to be slightly longer even though it is not.

FIGS. 3(a) and (b) are backscattered electron SEM micrograph images of attempts to directly etch the AlGaAs in un-oxidized VCL mesas using in FIG. 3(a) a 1:100 HCl:$H_2O$ solution, and in FIG. 3(b) a 1:10 BOE:$H_2O$ solution.

FIG. 6 is a cross-sectional SEM image of the top DBR of an oxide apertured VCL after a 920° C., 30 s rapid thermal anneal (RTA). The dark features indicated are voids that were once the GaAs layers of the DBR.

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

The present invention is essentially directed at a process of forming a Vertical Cavity Laser (VCL) structure that includes using an intermixing technique that overcomes the previously-described lateral diffusion problems. This process provides the desired lateral carrier confinement (LCL) while maintaining the current and optical confinement of buried apertures in VCL's [4]. However, it is noted that standard intermixing techniques proved troublesome because it was discovered that the high temperature annealing needed to activate the intermixing process degraded the VCL structure. Issues such as dopant diffusion, compositional intermixing of adjacent epitaxial layers, and new degradation mechanisms were found to render the resulting devices inoperable. In particular, the oxide formed by steam oxidation of high aluminum content AlGaAs layers [5], which will be referred to simply as oxide, was found to be responsible for a perplexing degradation mechanism during a high temperature anneal. To overcome this degradation, the typical VCL-forming process was modified in accordance with the present invention to include the use of low diffusivity dopants and oxide etching for reasons that will be discussed shortly.

The degradation of the VCL structures during high temperature annealing was explored in a series of experiments aimed at using both the standard and the aforementioned modified VCL-forming technique in an attempt to provide a structure exhibiting the needed LCL that ameliorates the lateral diffusion problem. These experiments will now be described.

Figure 1:
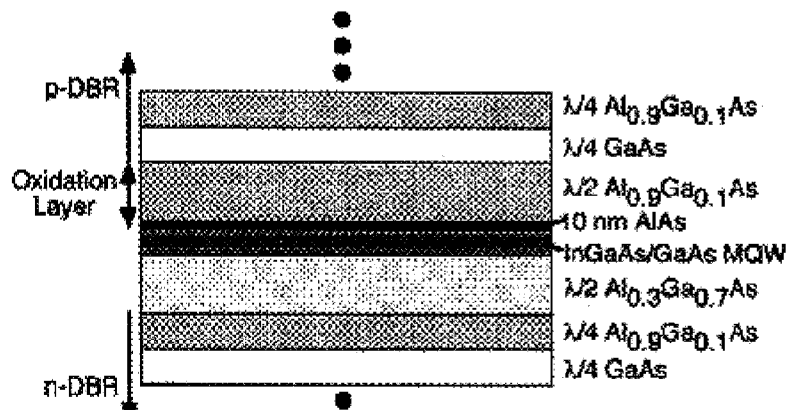
FIG. 1 is a schematic of a typical VCL structure near the active region.

All material growths in the experimentation were done by solid-source molecular beam epitaxy (MBE), using, for the acceptor dopant, either beryllium, or carbon via a $CBr_4$ doping precursor, which is described in reference [6]. Two VCL structures were grown using either Be or C for the p-type dopant and Si for the n-type. The details of the structure, shown in FIG. 1, are based on a design in which the shape of the current aperture is tapered at the first standing wave null [2,3] for strong, low-loss optical confinement.

Circular mesas of various sizes were defined using a reactive ion chlorine etch, stopping two periods into the n-mirror. Then the exposed AlAs and AlGaAs layers were oxidized in a quartz tube furnace at 400° C. into which water vapor was introduced by flowing nitrogen gas at 0.8 L/min through a bubbler containing de-ionized water at 80° C.

At this point, some of the structures produced by the foregoing process were set aside, while others had the oxide selectively removed using various strong alkaline solutions including KOH and NaOH. It was noted that some of the structures were subjected to a concentrated $NH_4OH$ solution (28% w/w), but that no etching of the oxide was observed. In short, it was found that the lateral etch rate of the oxide decreases very rapidly below a pH of about 13. The preferred etching process based on the observations uses a 1:12 KOH (45% w/w):$H_2O$ solution, which etches the oxide at a rate of approximately 4 $\mu$m/min. As shown in the before and after images of FIGS. 2(a) and (b), the resulting undercut maintains the original tapered shape of the oxide. Although direct etching of AlAs with HCl or HF has been used to form abrupt current apertures [7], it was found that the desired undercut shape was difficult to achieve with direct etching (see FIGS. 3(a) and (b)).

Some of the devices, including both those which had the oxide etched and those that did not, were then prepared for the rapid thermal anneal (RTA) by depositing 100 nm of silicon nitride by plasma enhanced chemical vapor deposition (PECVD). These devices were subjected in accordance with a standard intermixing technique to a 920° C. RTA for 180 s during which a proximity cap of GaAs wafers was used to minimize arsenic out-diffusion.

Windows were opened in the nitride with a $CF_4/O_2$ plasma etch, and AuZn and AuGe based p and n contacts were deposited, respectively.

Figure 4:
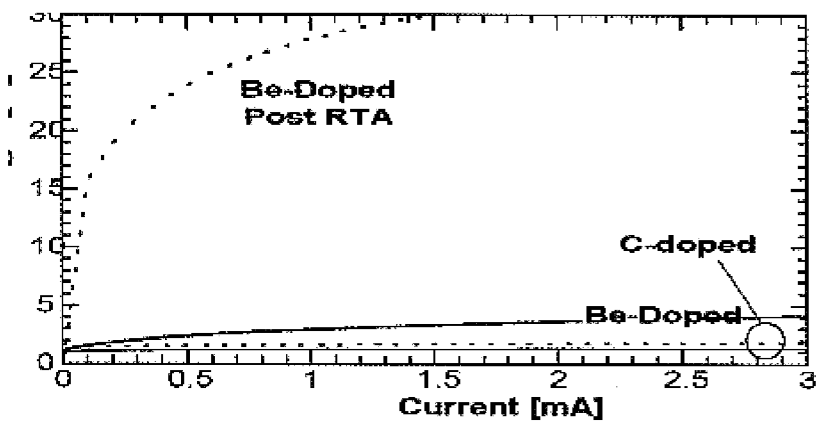
FIG. 4 is a graph comparing the current-voltage characteristics of C-doped and Be-doped VCL structures with a 20 $\mu$m diameter current aperture. The un-annealed characteristics are shown by the solid curves. The dashed curves illustrate the effects of a 920° C., 3 min anneal.

It was found that the degradation upon annealing the oxidized, and unetched, VCL devices above 900° C. for more than a few seconds is surprisingly severe. Beryllium, a common p-type dopant in MBE growth, proved to be unsuitable for such a process. The high diffusivity of Be at this temperature causes such an extensive redistribution of the doping profile that the diode turn-on voltage and differential resistance of a typical VCL structure is severely affected (see FIG. 4). In fact, it was observed that none of the annealed Be-doped structures lased. The C-doped devices, on the other hand, still lased after annealing and showed only slightly higher voltages. Silicon and carbon have diffusivities 10 and 100 times less than beryllium, respectively [8], and so it is speculated that silicon distribution in the n-type distributed Bragg reflector (DBR) is the main cause for the slight increase in device resistance.

Figure 5:
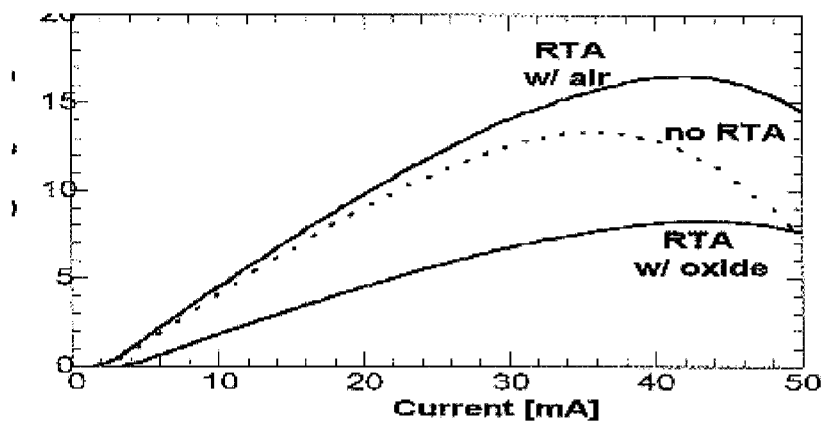
FIG. 5 is a graph of the light-current (LI) characteristics of annealed oxide and air-gap apertured VCLs compared to un-annealed devices. The aperture diameter of both devices is 18 $\mu$m. Only one curve is shown for un-annealed devices for clarity since the LI curves are nearly identical.

However, even in the C-doped devices, the presence of oxide in the VCL structure during the annealing process results in serious degradation of the light-current (LI) characteristics. In contrast, the air-gap structures formed by etching out the oxide showed little change. As shown in the graph of FIG. 5, an oxide apertured device suffered a 50% decrease in external efficiency while the air-gap structure maintained its output performance after annealing.

Cross-section scanning electron microscopy (SEM) of the oxide apertured devices before, and after (see FIG. 6), annealing revealed a structural degradation in which voids have formed where the GaAs DBR layers once were. The mechanism behind this phenomenon is unclear except that it occurs in the presence of oxide and not in an air-gap apertured device such as that formed by removing the oxide in the manner described above. It suggests that a reaction of the GaAs with the oxide occurs at high temperatures which partially absorbs the GaAs. The unintentional voids introduce excess scattering loss that is manifest in the reduced differential efficiency of the annealed oxide aperture devices. Also, there is a noticeable downward bending of the layers along the circumference of the device which was not present before annealing. This is attributed to densification of the oxide during the high temperature process. In comparison, no significant structural changes were observed in the air-gap structures.

Figure 7:
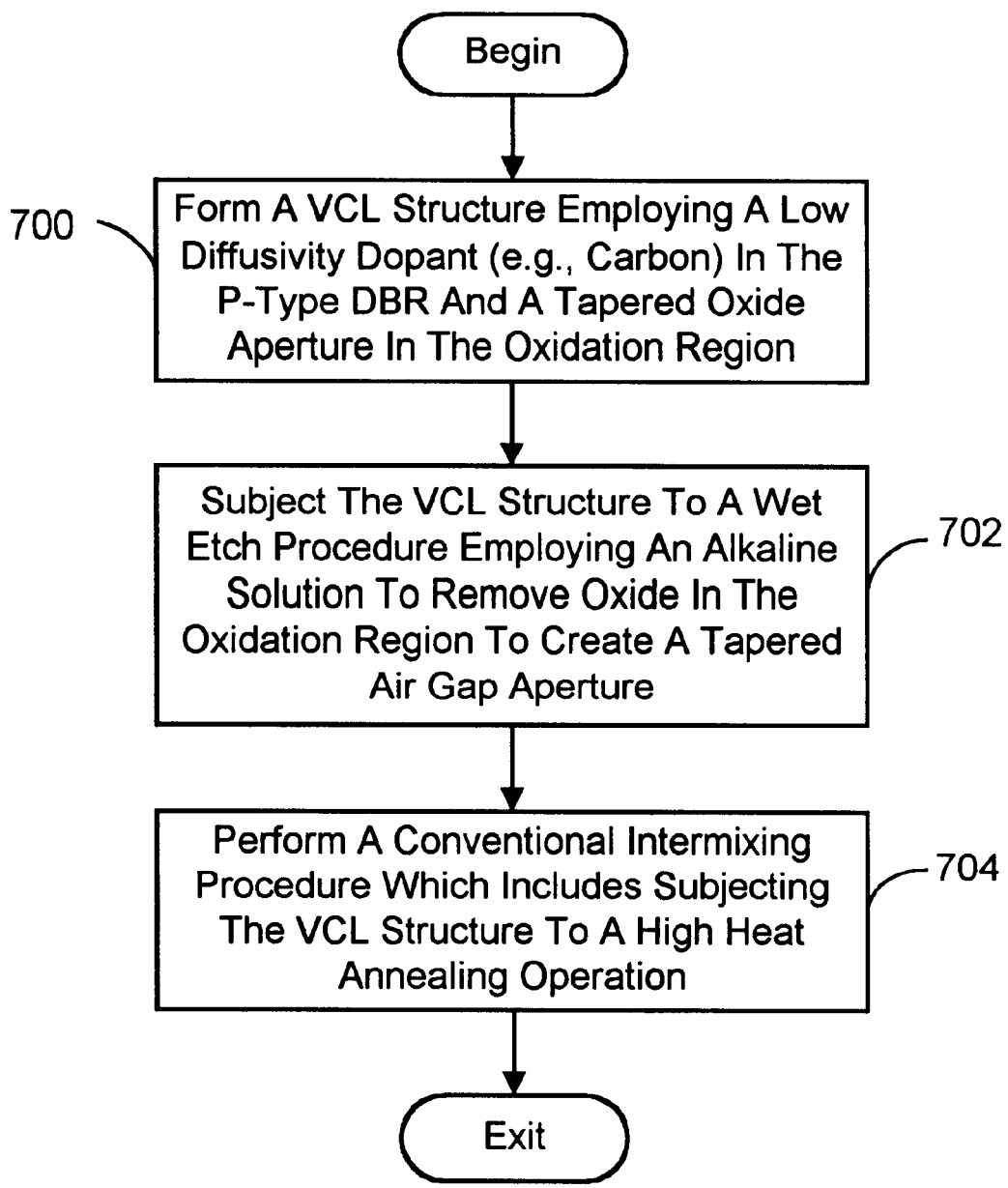
FIG. 7 is a flow chart diagramming a generalized process for forming a VCL structure in accordance with the present invention.

Thus, referring to the flow diagram of FIG. 7, a VCL structure is generally formed in accordance with the present invention by employing standard VCL-forming methods [2,3] with the exception that the dopant used in the p-type distributed Bragg reflector (DBR) is restricted to a low diffusivity dopant, such as carbon (process action 700). It is noted that the aforementioned standard method includes the formation of oxide apertures in the oxidation region of the VCL, and preferably tapered oxide apertures. Once formed, the VCL structure is subjected to a wet etch procedure employing an alkaline solution, such as a KOH-based solution having a pH greater than about 12 (and preferably greater than about 13), to remove the oxide in the oxidation region (process action 702). This last step results in the creation of air-gap apertures. If a tapered oxide aperture was initially formed in the oxidation region, the resulting tapered air-gap apertures will have low optical loss properties similar to the tapered oxide aperture design described in reference [3]. Next, a conventional intermixing procedure is performed, which includes subjecting the VCL structure to a high heat annealing operation to ensure impurity-free intermixing (process action 704). The actual laser is then fabricated using the now annealed VCL structure by the addition of various contacts and coatings as described previously and in references [2,3].

While the invention has been described in detail by specific reference to preferred embodiments thereof, it is understood that variations and modifications thereof may be made without departing from the true spirit and scope of the invention. For example, it is further believed the oxide removal aspects of the foregoing embodiment of the invention may have a broader application outside the context of improving the performance of small-diameter VCLs. Particularly, the ability of the two-step oxide creation and removal process to create air gaps in buried layers of a semiconductor structure may be quite useful. Buried voids are often required in semiconductor structures. For example, in-plane lasers can employ air gap apertures. Further, the manufacture of electronic devices from semiconductor material often calls for a dielectric layer which can be an air gap. Voids may also be needed as a precursor step to filling them with other materials (e.g., spin-on glass as a dielectric, organic material for PMGI or metal for contacts) during the device's manufacture. The voids may also be required to have intricate shapes, such as the tapered profile required in the apertures of the previously-described VCLs.

In the past, it was attempted to form these voids via direct etching methods, with mixed results. For example, when it was attempted to form the air gap aperture in the previously-described VCL structure using direct etching methods, the desired tapered profile could not be achieved. This can be seen in FIG. 4. However, layers of semiconductor materials containing high percentages of aluminum, or another oxidizable material, can be readily formed during the fabrication of a semiconductor structure (e.g., via solid-source molecular beam epitaxy techniques) to create an oxidation region. The region is then oxidized and etched as described previously to create the desired voids.

The oxidation region layers can also be graded so as to control the extent of the oxidation, thereby creating intricate shapes. Thus, when the oxide is removed, a void having the same intricate shape is created within the semiconductor structure. More particularly, the oxidation region is formed from a series of layers having a graded content of an oxidizable material such that one or more of the layers vary in overall concentration of the oxidizable material in comparison to the other layers. The oxidizable material concentrations among the layers are selected to result in oxidized material after oxidation that takes on a desired 3D shape. Thus, when the region is oxidized at least a portion of the oxidizable material of the oxidation region is oxidized to form a pattern of oxidized material that propagates inwardly from each exposed surface of the region at a rate dictated by the concentration of the oxidizable material in each layer. This oxidation pattern is in the form of the desired 3D shape. The subsequent etching process then results in a void in the oxidation region having the desired shape.

References

[1] R. L. Naone, E. R. Hegblom, B. J. Thibeault, and L. A. Coldren, "Oxidation of AlGaAs layers for tapered apertures in vertical-cavity lasers," *Electron. Lett.*, vol. 33, pp. 300–301, 1997.

[2] E. R. Hegblom, B. J. Thibeault, R. L. Naone, and L. A. Coldren, "Vertical cavity lasers with tapered oxide apertures for low scattering loss," *Electron. Left.*, vol. 33, pp. 869–871, 1997.

[3] E. R. Hegblom, N. M. Margalit, A. Fiore, and L. A. Coldren, "Small efficient vertical cavity lasers with tapered oxide apertures," *Electron. Lett.*, vol. 34, pp. 895–897, 1998.

[4] R. L. Naone, P. D. Floyd, D. B. Young, E. R. Hegblom, T. A. Strand, and L. A. Coldren, "Interdiffused quantum wells for lateral carrier confinement in VCSEL's," *IEEE J Sel. Top. Quantum Electron.*, vol. 4, pp. 706–714, 1998.

[5] J. M. Dalesasse, N. Holonyak, Jr., A. R. Sugg, T. A. Richard, and N. El-Zein, "Hydrolyzation oxidation of $Al_xGa_{1-x}$ As-AlAs-GaAs quantum well heterostructures and superlattices," *Appl. Phys. Lett.*, vol. 57, pp. 2844–2846, 1990.

[6] W.-Y. Hwang, D. L. Miller, Y. K. Chen, and D. A. Humphrey, "Carbon doping of InGaAs in solid-source molecular beam epitaxy using carbon tetrabromide," *J. Vac. Sci. Technol. B*, vol. 12, pp. 1193–1196, 1994.

[7] J. W. Scott, B. J. Thiebault, D. B. Young, and L. A. Coldren, "High efficiency submilliamp vertical cavity lasers with intracavity contacts," *IEEE Photon. Tech. Lett.*, vol. 6, pp. 678–680, 1994.

[8] E. F. Schubert, *Doping in III-V Semiconductors*, Cambridge University Press, Cambridge, UK, 1st edition, 1993.

Wherefore, what is claimed is:

1. A vertical cavity laser structure comprising:
   an oxidation region comprising a tapered air aperture;
   a first distributed Bragg reflector (DBR) region overlying the oxidation region which contains oxidizable material and is doped with a p-type dopant exhibiting a low diffusivity; and
   a second DBR region underlying the oxidation region which is doped with an n-type dopant; wherein,
   the structure has been subjected to an intermixing procedure which includes a high temperature annealing operation to inhibit lateral carrier diffusion away from the center of an active region of the vertical cavity laser structure.

2. The system of claim 1, wherein the p-type dopant of the first DBR region is carbon.

3. A process of forming a vertical cavity laser including an oxidation region, a first distributed Bragg reflector (DBR) region having at least some oxidizable material overlying the oxidation region which is doped with a p-type dopant, and a second DBR region underlying the oxidation region which is doped with un n-type dopant said process comprising the actions of:
   forming the first DBR region using a p-type dopant exhibiting a low diffusivity;
   etching a portion of the oxidizable material of both the first DBR and oxidation regions and forming an air aperture in the oxidation region; and
   performing an intermixing procedure which includes a high temperature annealing operation to inhibit lateral carrier diffusion away from the center of an active region of the vertical cavity laser.

4. The process of claim 1, wherein the process action of forming an air aperture in the oxidation region comprises the action of forming a tapered air aperture.

5. The process of claim 1, wherein the action of forming the first DBR region using a p-type dopant exhibiting a low diffusivity, comprises using carbon as the dopant.

6. The process of claim 1, wherein the action of etching a portion of the oxidizable material of both the first DBR and oxidation regions and forming the air aperture in the oxidation region, comprises the actions of:
   forming the oxidation region from a series of layers having a graded content of an oxidizable material such that middle layer comprises the greatest overall concentration of the oxidizable material and the layers overlying and underlying the middle layer comprise overall concentrations of the oxidizable material that are progressively less the further the layer is from the middle layer;
   oxidizing a portion of the oxidizable material of both the DBR and oxidation regions which forms a pattern tapering inwardly from a peripheral, exposed surface of the oxidation region;
   etching the oxidized portion of the first DBR region and oxidation layer using an alkaline solution to remove the oxidized portion, thereby creating a DBR with no oxide and a air-gap in the oxidation region.

7. The process of claim 6, wherein the oxidizable material is aluminum.

8. The process of claim 7, wherein said middle layer is formed of AlGaAs with an aluminum concentration greater than about 95%.

9. The process of claim 8, wherein the layers of the oxidation region immediately adjacent the middle layer are formed of AlGaAs with an aluminum concentration less than that of the layer said middle layer but greater than about 70%.

10. The process of claim 6, wherein the alkaline solution comprising one of (i) KOH or (ii) NaOH.

11. The process of claim 6, wherein the alkaline solution has a pH of greater than about 13.

12. The process of claim 11, wherein the alkaline solution is a 1:12 KOH (45% w/w):$H_2O$ solution.

13. A process of forming a vertical cavity laser including an active region formed of materials for providing gain to the laser mode, an oxidation region overlying the active region formed of semiconductor materials comprising a relatively high percentage of aluminum exceeding about 95 percent, a first distributed Bragg reflector (DBR) region overlying the oxidation region formed of semiconductor materials comprising pairs of layers having different indexes of refraction, one of which containing a relatively small percentage of aluminum not exceeding about 10 percent and the other containing a relatively high percentage of aluminum exceeding about 95 percent and which pairs are both doped with a p-type dopant, and a second DBR region underlying the active region which is doped with an n-type dopant, said process comprising the actions of:
   forming the first DBR region using a p-type dopant exhibiting a low diffusivity;
   oxidizing a portion of the higher aluminum containing layers in the DBR and oxidation regions,
   etching the first DBR and oxidation regions to remove substantially all of the oxide in the DBRs and at least a portion of the oxidized aluminum in the oxidation region forming at least one tapered air aperture in the oxidation region; and
   performing an intermixing procedure which includes a high temperature annealing operation to inhibit lateral carrier diffusion away from the center of an active region of the vertical cavity laser.

14. The process of claim 13, wherein the oxide is removed with an alkaline solution.

15. The process of claim 14, wherein the alkaline solution comprising one of (i) KOH or (ii) NaOH.

16. The process of claim 14, wherein the alkaline solution has a pH of greater than about 13.

17. The process of claim 16, wherein the alkaline solution is a 1:12 KOH (45% w/w):$H_2O$ solution.

* * * * *